(12) United States Patent
Arai et al.

(10) Patent No.: US 10,175,073 B2
(45) Date of Patent: Jan. 8, 2019

(54) DIFFERENTIAL PRESSURE DETECTION ELEMENT, FLOW RATE MEASUREMENT DEVICE, AND METHOD OF MANUFACTURING DIFFERENTIAL PRESSURE DETECTION ELEMENT

(71) Applicant: FUJIKURA LTD., Tokyo (JP)

(72) Inventors: Hayato Arai, Chiba (JP); Tatsuya Shioiri, Chiba (JP); Naoki Takayama, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/557,018

(22) PCT Filed: Feb. 1, 2017

(86) PCT No.: PCT/JP2017/003593
§ 371 (c)(1),
(2) Date: Sep. 8, 2017

(87) PCT Pub. No.: WO2017/154424
PCT Pub. Date: Sep. 14, 2017

(65) Prior Publication Data
US 2018/0245955 A1    Aug. 30, 2018

(30) Foreign Application Priority Data
Mar. 10, 2016 (JP) .................. 2016-047102

(51) Int. Cl.
*G01F 1/38* (2006.01)
*B81B 3/00* (2006.01)
(Continued)

(52) U.S. Cl.
CPC ............. *G01F 1/383* (2013.01); *B81B 3/00* (2013.01); *B81B 3/0072* (2013.01); *B81C 1/00* (2013.01);
(Continued)

(58) Field of Classification Search
CPC combination set(s) only.
See application file for complete search history.

(56) References Cited

U.S. PATENT DOCUMENTS 8,080,869 B2 * 12/2011 Okudo ............... B81C 1/00269
257/704
8,302,494 B2 * 11/2012 Han ........................ G01N 3/00
73/862.634

(Continued)

FOREIGN PATENT DOCUMENTS

| JP | 2013-234853 A | 11/2013 |
|---|---|---|
| JP | 5656191 B2 | 1/2015 |
| JP | 5778619 B2 | 9/2015 |

*Primary Examiner* — Jewel V Dowtin
(74) *Attorney, Agent, or Firm* — Osha Liang LLP (57) ABSTRACT

A differential pressure detection element includes: a support portion having an opening; a cantilever portion supported in a cantilever manner by the support portion so as to protrude into the opening; a diffusion layer including a piezoresistive portion provided at a fixed end of the cantilever portion; a pair of wiring portions electrically connected to the diffusion layer; a first insulating layer covering the diffusion layer; and a second insulating layer laid on the first insulating layer. A linear expansion coefficient of the first insulating layer is smaller than a linear expansion coefficient of a material of which the cantilever portion is composed, and a linear expansion coefficient of the second insulating layer is larger than the linear expansion coefficient of the first insulating layer.

8 Claims, 8 Drawing Sheets

(51) Int. Cl.
*B81C 1/00* (2006.01)
*G01L 13/06* (2006.01)
*G01F 1/34* (2006.01)

(52) U.S. Cl.
CPC ............ *B81C 1/00666* (2013.01); *G01F 1/34* (2013.01); *G01L 13/06* (2013.01); *B81B 2201/0264* (2013.01); *B81B 2203/0118* (2013.01); *B81C 2201/0173* (2013.01)

(56) References Cited

U.S. PATENT DOCUMENTS

| | | | |
|---|---|---|---|
| 8,573,069 B2 * | 11/2013 | Nishiwaki | B25J 13/083 |
| | | | 73/862.044 |
| 9,551,621 B2 | 1/2017 | Shimoyama et al. | |
| 9,661,411 B1 * | 5/2017 | Han | H04R 1/14 |
| 2013/0283922 A1 * | 10/2013 | Qualtieri | G01Q 10/045 |
| | | | 73/774 |
| 2014/0183669 A1 * | 7/2014 | Xu | G01C 19/5656 |
| | | | 257/415 |
| 2015/0096388 A1 | 4/2015 | Shimoyama et al. | |

* cited by examiner

DIFFERENTIAL PRESSURE DETECTION ELEMENT, FLOW RATE MEASUREMENT DEVICE, AND METHOD OF MANUFACTURING DIFFERENTIAL PRESSURE DETECTION ELEMENT

TECHNICAL FIELD

The present invention relates to a differential pressure detection element for detecting a pressure difference, a flow rate measurement device for obtaining a flow rate from a pressure difference between an upstream side and a downstream side in a flow passage by using the differential pressure detection element, and a method of manufacturing the differential pressure detection element.

For designated countries that are permitted to be incorporated by reference in documents, the content described in Japanese Patent Application No. 2016-047102 filed in Japan on Mar. 10, 2016 is incorporated herein by reference into this specification.

BACKGROUND ART

Patent Document 1 discloses a pressure sensor including: a sensor main body having a communicating opening formed therein; a cantilever provided inside the communicating opening in a state where the cantilever is supported in a cantilever manner by the sensor main body; a piezo-resistor formed at a base end portion of the cantilever; a wiring portion connected to the piezo-resistor, and an insulating film covering the piezo-resistor and the wiring portion (for example, refer to Patent Document 1 (Paragraph [0029])).

CITATION LIST

Patent Document

Patent Document 1: JP 2013-234853 A

The cantilever of the pressure sensor is composed of a silicon active layer of an SOI substrate. On the other hand, since the linear expansion coefficient of silicon oxide is smaller than the linear expansion coefficient of silicon, if the above insulating film is formed with a silicon oxide film, in the cooling process after film formation, the cantilever is greatly contracted in comparison with the insulating film. The cantilever greatly warps in the offset state (the state where no pressure is applied to the cantilever), and a large initial stress occurs in the piezo-resistor formed at the base of the cantilever, so that the offset voltage (the output voltage of the differential pressure detection element in the offset state) increases.

SUMMARY

One or more embodiments of the invention provide a differential pressure detection element having a decreased offset voltage by reducing an initial warp amount of a cantilever portion in an offset state, a flow rate measurement device using the differential pressure detection element, and a method of manufacturing the differential pressure detection element.

[1] The differential pressure detection element according to one or more embodiments of the present invention is a differential pressure detection element including: a support portion having an opening; a cantilever portion supported in a cantilever manner by the support portion so as to protrude into the opening; a diffusion layer including a piezoresistive portion provided at a fixed end of the cantilever portion; a pair of wiring portions electrically connected to the diffusion layer; a first insulating layer covering the diffusion layer; and a second insulating layer laid on the first insulating layer, wherein a linear expansion coefficient of the first insulating layer is smaller than a linear expansion coefficient of a material of which the cantilever portion is composed, and a linear expansion coefficient of the second insulating layer is larger than the linear expansion coefficient of the first insulating layer.

[2] In one or more embodiments, the cantilever portion may be composed of silicon, the first insulating layer may be a silicon oxide layer, and the second insulating layer may be a silicon nitride layer.

[3] In one or more embodiments, the following Mathematical Formula (1) may be satisfied.

[Math. 1]

$$0 < \frac{w_2}{w_1} \leq \frac{1}{2} \qquad (1)$$

Herein, in the above Mathematical Formula (1), $w_1$ is a thickness of the first insulating layer, and $w_2$ is a thickness of the second insulating layer.

[4] In one or more embodiments, the diffusion layer may include a lead portion electrically connecting a pair of the wiring portions and the piezoresistive portion in series, and an impurity concentration in the lead portion may be higher than an impurity concentration in the piezoresistive portion.

[5] The flow rate measurement device according to one or more embodiments of the present invention is a flow rate measurement configured to detect a flow rate of a fluid flowing through a main flow passage, including: the above differential pressure detection element; a bypass passage communicating with the main flow passage through a pair of communication ports and being provided with the differential pressure detection element; and a flow rate calculation unit calculating the flow rate of the fluid on the basis of an output of the differential pressure detection element.

[6] The method of manufacturing the above differential pressure detection element according to one or more embodiments of the present invention is a method of manufacturing the above differential pressure detection element including: a first step of forming the diffusion layer by doping one silicon layer of the SOI substrate with impurities; a second step of forming the first insulating layer on the diffusion layer; and a third step of forming the second insulating layer on the first insulating layer, wherein a layer formation temperature in the second step is 1200° C. or less, and wherein a layer formation temperature in the third step is 800° C. or less.

[7] In one more embodiments, the following Mathematical Formula (2) may be satisfied.

[Math. 2]

$$0 < \frac{w_2}{w_1} \leq -\frac{E_1(1-v_2)(\alpha_1-\alpha_0)dT_1}{E_2(1-v_1)(\alpha_2-\alpha_1)dT_2} \times 2 \qquad (2)$$

In the above Mathematical Formula (2), $\alpha_0$ is a linear expansion coefficient of a material of which the cantilever portion is composed, $\alpha_1$ is a linear expansion coefficient of the first insulating layer, $v_1$ is a Poisson's ratio of the first insulating layer, $E_1$ is a Young's modulus of the first insulating layer, $dT_1$ is a temperature difference in the cooling process after forming the first insulating layer, $w_1$ is a thickness of the first insulating layer, $\alpha_2$ is a linear expansion coefficient of the second insulating layer, $v_2$ is a Poisson's ratio of the second insulating layer, $E_2$ is a Young's modulus of the second insulating layer, $dT_2$ is a temperature difference in the cooling process after forming the second insulating layer, and $w_2$ is a thickness of the second insulating layer.

[8] In one or more embodiments, the first step may include forming a thermal silicon oxide layer by performing a thermal oxidation process on the silicon layer, the second step may include: forming a deposited silicon oxide layer on the thermal silicon oxide layer by a CVD method; and forming the first insulating layer by performing an annealing process on the thermal silicon oxide layer and the deposited silicon oxide layer, the third step may include forming the silicon nitride layer by a CVD method, the layer formation temperature in the second step may be a temperature of the annealing process in the second step, and the lay formation temperature in the third step may be a temperature of the CVD method in the third step.

In one or more embodiments of the present invention, a differential pressure detection element includes a second insulating layer laid on a first insulating layer, a linear expansion coefficient of the first insulating layer is smaller than a linear expansion coefficient of a material of which a cantilever portion is made, and a linear expansion coefficient of the second insulating layer is larger than the linear expansion coefficient of the first insulating layer. Therefore, since the initial warp generated in the cantilever portion in the offset state is reduced, the offset voltage of the differential pressure detection element can be reduced.

DETAILED DESCRIPTION

Hereinafter, embodiments of the invention will be described with reference to the drawings.

Figure 1:
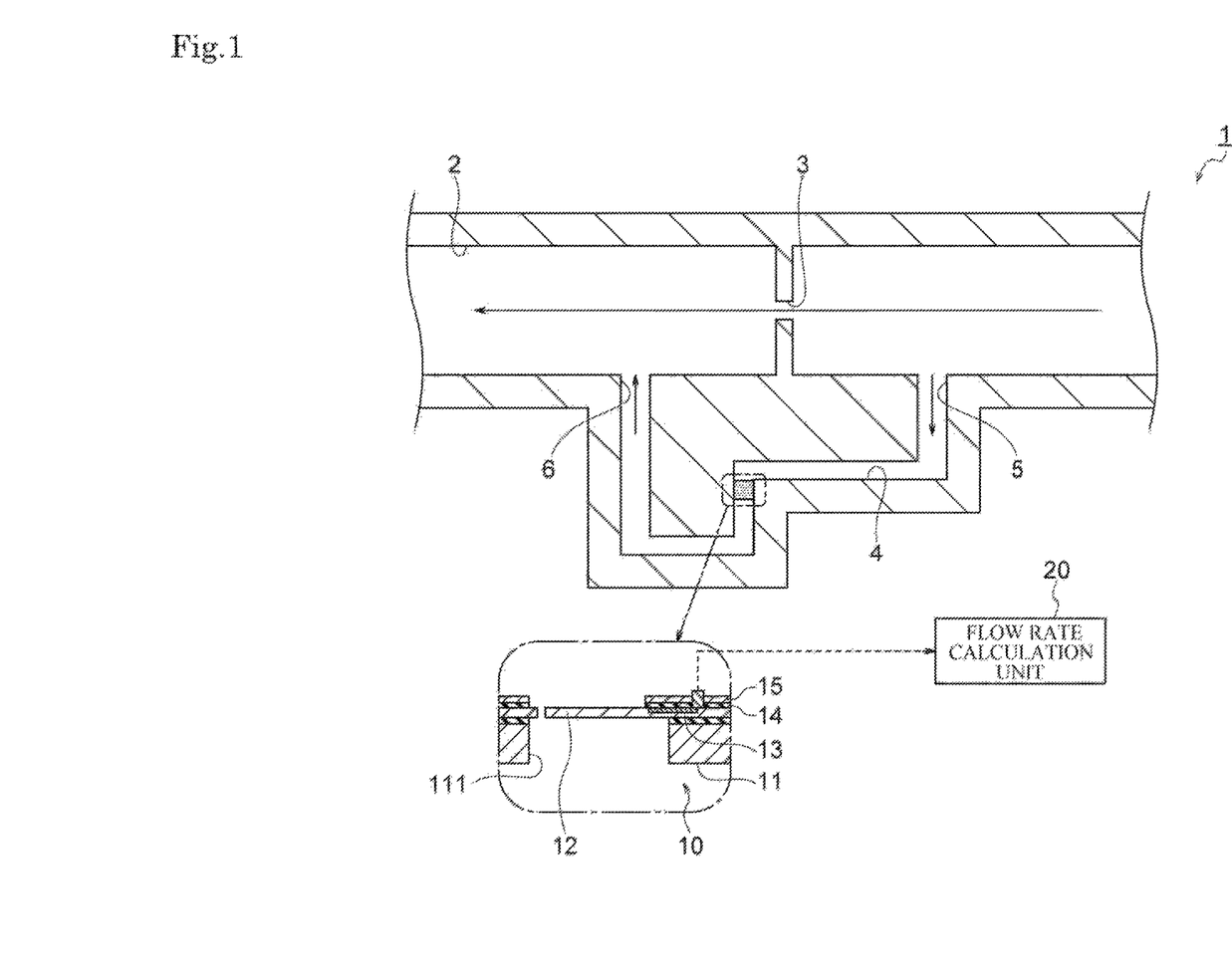
FIG. 1 is a diagram illustrating a configuration of a flow rate measurement device using a differential pressure detection element according to one or more embodiments of the invention.

FIG. 1 is a diagram illustrating a configuration of a flow rate measurement device using a differential pressure detection element according to one or more embodiments.

As illustrated in FIG. 1, a flow rate measurement device 1 one or more embodiments is a device that measures a flow rate of fluid flowing through a main flow passage 2. The flow rate measurement device 1 is configured to include: a differential pressure detection element 10 provided in a bypass passage 4 branched from the main flow passage 2; and a flow rate calculation unit 20 electrically connected to the differential pressure detection element 10. As a specific example of the fluid flowing through the main flow passage 2, there may be exemplified a gas such as air or a liquid such as water.

Although FIG. 1 illustrates the state in which the fluid flows from the right side to the left side in the main flow passage 2, in one or more embodiments, the flowing direction of the fluid is not particularly limited thereto. In some cases, the fluid may flow from the left side to the right side in the main flow passage 2.

The flow rate measurement device 1 detects a pressure difference between an upstream opening 5 and a downstream opening 6 of the bypass passage 4 by elastic deformation of the cantilever portion 12 of the differential pressure detection element 10, and the flow rate calculation unit 20 calculates the flow rate of the fluid flowing through the main flow passage 2 on the basis of the pressure difference.

In the example illustrated in FIG. 1, a throttle mechanism having the orifice 3 is provided in the main flow passage 2 in order to actively generate the pressure difference, but the invention is not particularly limited thereto. For example, instead of such a throttle mechanism, a straightening guide may be provided in the main flow passage 2, or the throttle mechanism may be omitted.

Figure 2:
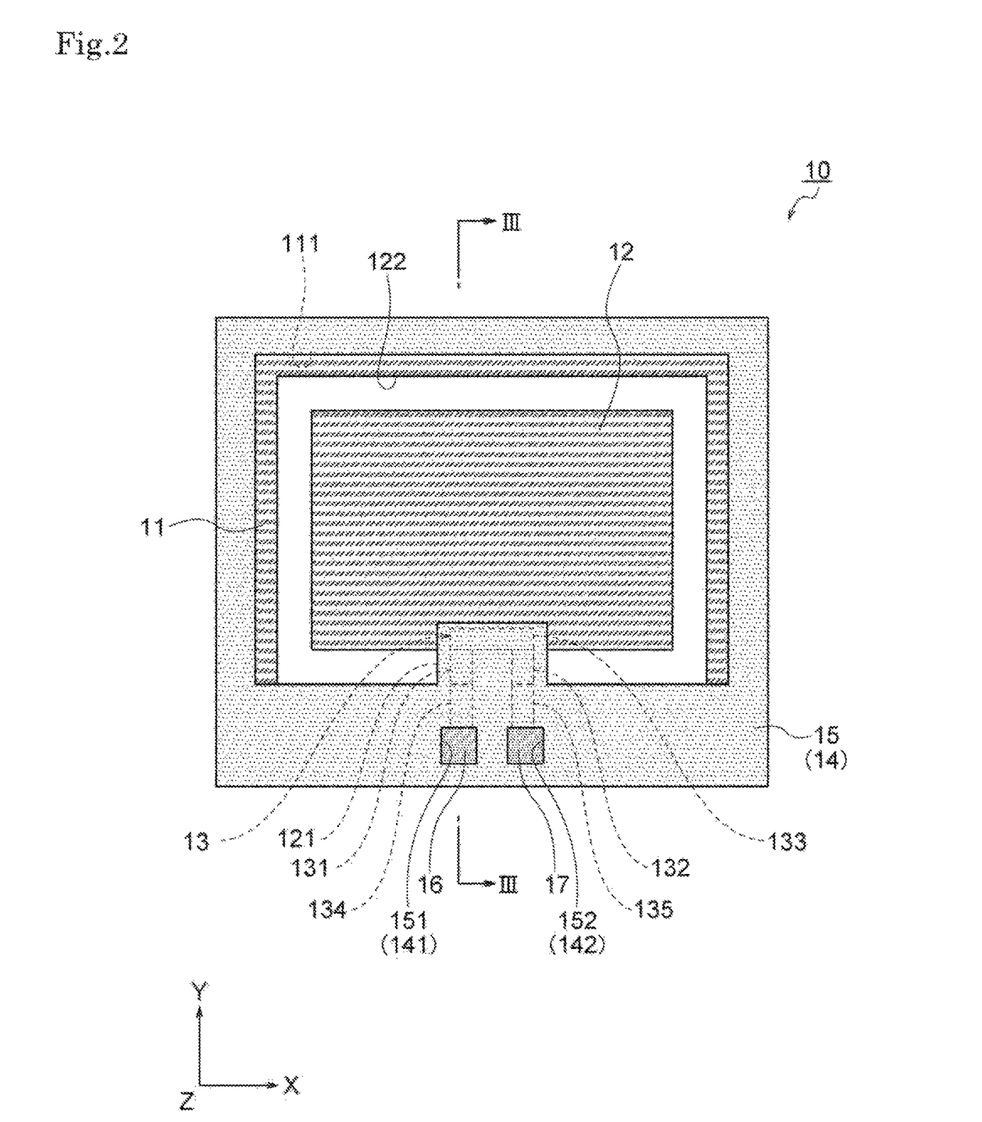
FIG. 2 is a plan view of the differential pressure detection element according to one or more embodiments of the invention.
Figure 3:
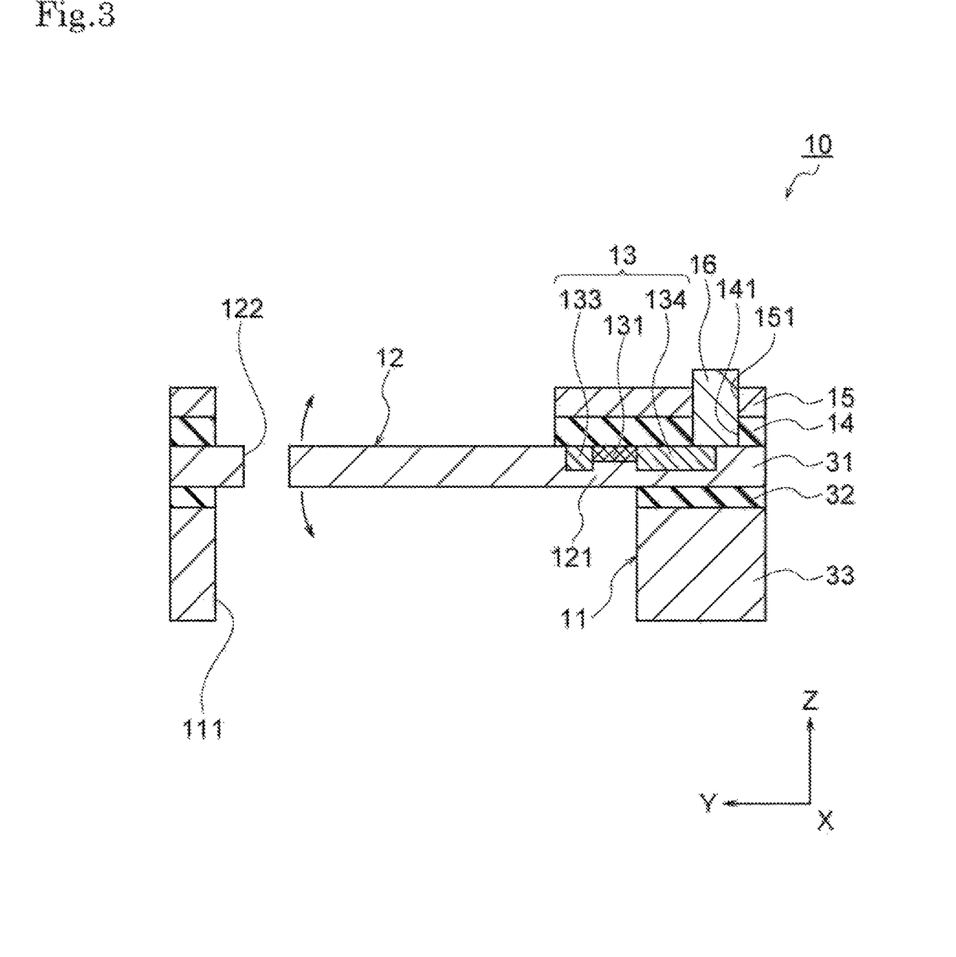
FIG. 3 is a cross-sectional view taken along line III-III of FIG. 2 according to one or more embodiments of the invention.
Figure 4A:
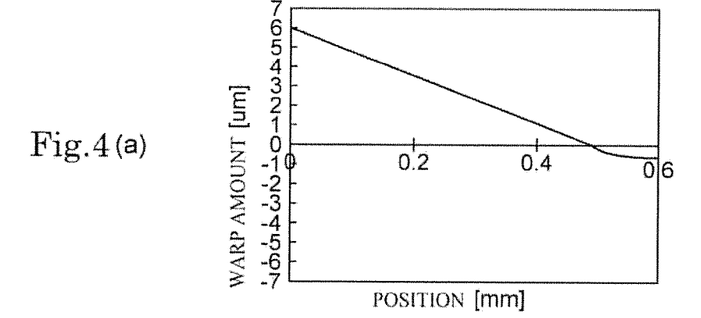
FIGS. 4(a) and 4(b) are graphs illustrating the warp amount of the differential pressure detection element according to one or more embodiments of the invention.
Figure 4B:
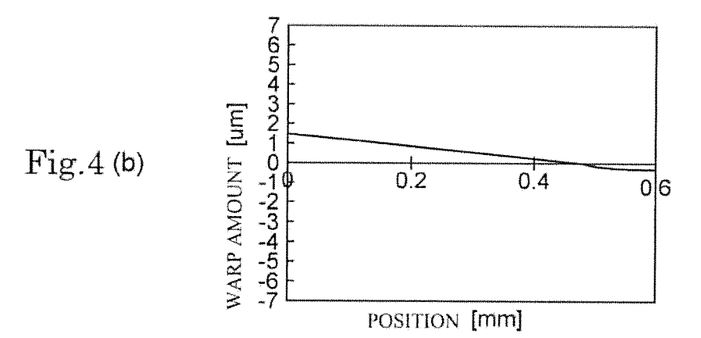
Figure 4C:
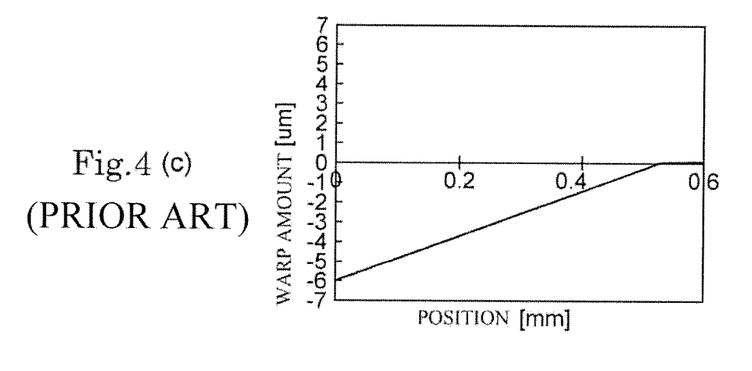
FIG. 4(c) is a graph illustrating the warp amount of a differential pressure detection element in the related art.

FIGS. 2 and 3 are a plan view and a cross-sectional view of the differential pressure detection element according to one or more embodiments. In addition, FIGS. 4(a) and 4(b) are graphs illustrating the warp amount of the differential pressure detection element according to one or more embodiments, and FIG. 4(c) is a graph illustrating the warp amount of a differential pressure detection element in the related art.

As illustrated in FIGS. 2 and 3, the differential pressure detection element 10 is an MEMS (Micro Electro Mechanical Systems) element configured to include a support substrate 11, a cantilever portion 12, a diffusion layer 13, a first insulating layer 14, a second insulating layer 15, and wiring portions 16 and 17. The support substrate of one or more embodiments corresponds to an example of a support portion in the invention.

As described later, the support substrate 11 and the cantilever portion 12 are integrally formed by processing an SOI (Silicon on Insulator) wafer 30. The support substrate 11 is configured as a laminate including a first silicon layer 31, a silicon oxide layer 32, and a second silicon layer 33. A rectangular opening 111 penetrating the support substrate 11 is formed on the support substrate 11.

On the other hand, the cantilever portion 12 includes only the first silicon layer 31. The cantilever portion 12 is supported in a cantilever manner by the support substrate 11 at the fixed end 121 of the cantilever portion 12 so as to protrude into the opening 111 of the support substrate 11. Therefore, except for the fixed end 121 of the cantilever portion 12, a gap 122 is secured between the outer edge of the cantilever portion 12 and the inner wall surface of a through-hole 111. Although not particularly limited, the gap 122 has a width of, for example, about 1 μm to 100 μm.

The diffusion layer 13 includes piezoresistive portions 131 and 132 and lead portions 133 to 135. A pair of the piezoresistive portions 131 and 132 is electrically connected in series to the wiring portions 16 and 17 described later by the lead portions 133 to 135. The piezoresistive portions 131 and 132 are formed by doping the first silicon layer 31 (n-type semiconductor) with p-type impurities. The piezoresistive portions 131 and 132 are provided at the fixed end 121 where the stress is at maximum in the cantilever portion 12 at the time of pressure application. The resistance values of the piezoresistive portions 131 and 132 are changed in accordance with the elastic deformation of the cantilever portion 12.

The wiring portions 133 to 135 of the diffusion layer 13 are also formed by doping the first silicon layer 31 with p-type impurities. However, the impurity concentration in the lead portions 133 to 135 is higher than the impurity concentration in the piezoresistive portions 131 and 132. Namely, in one or more embodiments, the piezoresistive portions 131 and 132 of the diffusion layer 13 are composed of a $p^-$ type semiconductor, whereas the lead portions 133 to 135 of the diffusion layer 13 are composed of a $p^+$ type semiconductor. As a result, the electrical resistance values of the piezoresistive portions 131 and 132 are higher than the electrical resistance values of the lead portions 133 to 135.

The first lead portion 133 electrically connects one end (upper end in FIG. 2) of the one piezoresistive portion 131 and one end (upper end in FIG. 2) of the other piezoresistive portion 132. On the other hand, the second lead portion 134 electrically connects the other end (lower end in FIG. 2) of the one piezoresistive portions 131 and the first wiring portion 16. In addition, the third lead portion 135 electrically connects the other end (the lower end in FIG. 2) of the other piezoresistive portion 132 and the second wiring portion 17.

The diffusion layer 13 may be formed by doping the first silicon layer 31 (p-type semiconductor) with n-type impurities. In this case, the piezoresistive portions 131 and 132 are composed of an $n^-$ type semiconductor, and the wiring portions 133 to 135 are composed of an $n^+$ type semiconductor.

The diffusion layer 13 is covered with the first insulating layer 14, so that electrical insulation properties of the piezoresistive portions 131 and 132, the lead portions 133 to 135, and the wiring portions 16 and 17 are secured. The first insulating layer 14 is configured as a layer having a linear expansion coefficient smaller than the linear expansion coefficient of silicon, and specifically, the first insulating layer is configured as a silicon oxide ($SiO_2$) layer. The first insulating layer 14 has a thickness $w_1$ of, for example, about 0.5 nm to 200 nm. In one or more embodiments, the first insulating layer 14 is formed on the fixed end 121 of the cantilever portion 12 including the diffusion layer 13 and the support substrate 11.

Furthermore, in one or more embodiments, the second insulating layer 15 is laid on the first insulating layer 14. The second insulating layer 15 is configured as a layer having a linear expansion coefficient larger than the linear expansion coefficient of the first insulating layer 14, and specifically, the second insulating layer configured as a silicon nitride (SiN) layer. The second insulating layer 15 has a thickness $w_2$ of, for example, about 3 nm to 100 nm.

As described in one or more embodiments above, if an insulating film is configured with a silicon oxide layer having a linear expansion coefficient smaller than the linear expansion coefficient of silicon, in the cooling process after the formation of the insulating film, the cantilever is greatly contracted in comparison with the insulating film. Therefore, the cantilever warps to the side opposite to the insulating film in the differential pressure detection element having a structure in the related art that has no second insulating layer. If the cantilever greatly warps in the offset state as described above, a large initial stress occurs in the piezoresistive portions formed at the base of the cantilever, so that the offset voltage (the output voltage of the differential pressure detection element in the offset state) increases. As the offset voltage increases, in some cases, the correction of the output of the differential pressure detection element or the like is adversely affected, so that the detection accuracy of the differential pressure detection element is deteriorated.

In contrast, in one or more embodiments, the second insulating layer 15 is laid on the first insulating layer 14, and the linear expansion coefficient of the second insulating layer 15 is set to be larger than the linear expansion coefficient of the first insulating layer 14. Therefore, in the cooling process after the formation of the second insulating layer 15, the second insulating layer 15 is also greatly contracted in comparison with the first insulating layer 14. As a result, the warp of the cantilever portion 12 can be canceled out, so that the offset voltage of the differential pressure detection element 10 can be reduced.

In this case, in one or more embodiments, the relationship between the thickness $w_1$ of the first insulating layer 14 and the thickness $w_2$ of the second insulating layer 15 satisfies the following Mathematical Formula (3). Therefore, the warp of the cantilever portion 12 can be more appropriately canceled out by the second insulating layer 15, and the symmetry of the sensitivity of the differential pressure detection element 10 with respect to the pressure application direction can be further improved.

[Math. 3]

$$0 < \frac{w_2}{w_1} \leq \frac{1}{2} \quad (3)$$

More specifically, as illustrated in FIG. 4(c), in the case of a differential pressure detection element having a structure in the related art that has a silicon oxide layer with a thickness of 200 nm and has no silicon nitride layer, in an offset state (in a state where no pressure is applied to the cantilever portion), the distal end of the cantilever portion is warped by about 6 μm in the −Z direction.

On the other hand, as illustrated in FIG. 4(a), in the case where the differential pressure detection element 10 has the silicon oxide layer 14 with a thickness of 100 nm and the silicon nitride layer 15 with a thickness of 50 nm ($w_2/w_1=½$), in the offset state, the warp of the distal end of the cantilever portion 12 is about 6 μm in the +Z direction.

Furthermore, as illustrated in FIG. 4(b), in the case where the differential pressure detection element has the silicon oxide layer 14 with a thickness of 100 nm and the silicon nitride layer 15 with a thickness of 25 nm ($w_2/w_1=¼$), in the offset state, the warp of the distal end of the cantilever portion 12 is about 1 μm in the +Z direction, and the warp of the cantilever portion 12 can be almost suppressed.

In FIGS. 4(a) to 4(c), the vertical axis represents a displacement amount along the Z axis (refer to FIGS. 2 and 3) of the cantilever portion 12 in the offset state. In the same figure, the horizontal axis represents the distance from the distal end of the cantilever portion 12 along the −Y direction (refer to FIGS. 2 and 3).

The first wiring portion 16 is provided on the upper surface 112 of the support substrate 11 through the openings 141 and 151 of the first and second insulating layers 14 and 15 so as to be in contact with the end portion (lower end in FIG. 2) of the second lead portion 134 and is electrically connected to the second lead portion 134. The second wiring portion 17 is also provided on the upper surface 112 of the support substrate 11 through the openings 142 and 152 of the first and second insulating layers 14 and 15 so as to be in contact with the end portion (lower end in FIG. 2) of the third lead portion 135 and is electrically connected to the third lead portion 135. The wiring portions 16 and 17 are electrically connected to the above-described flow rate calculation unit 20 through wiring portions or the like not illustrated in particular. A bridge circuit may be configured by using wiring portions, lead portion, and piezoresistive portions. In this case, a small change in resistance value can be extracted as a large output.

Figure 5:
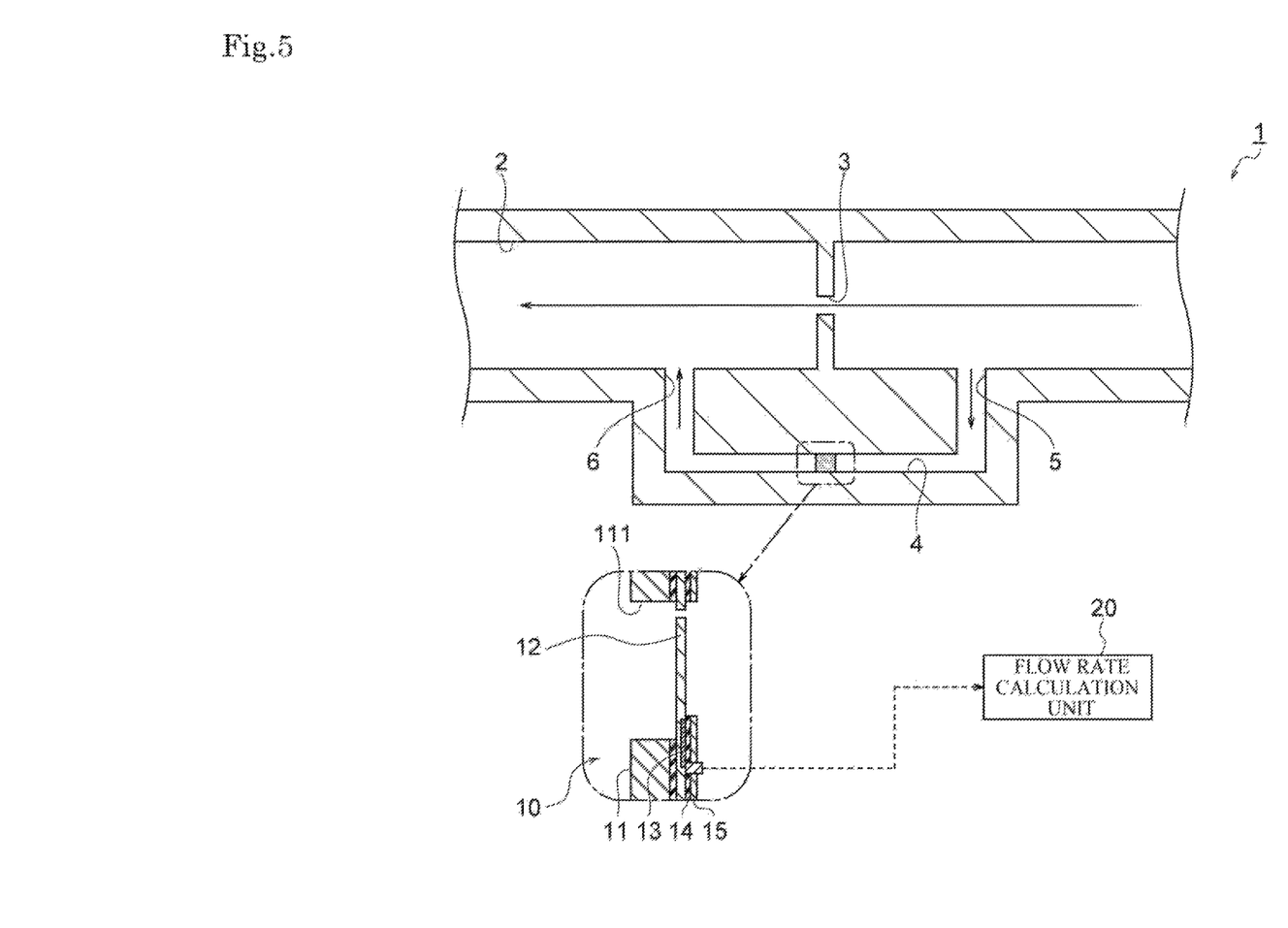
FIG. 5 is a diagram illustrating a modified example of the bypass passage according to one or more embodiments of the invention.

As illustrated in FIG. 1, the above-described differential pressure detection element 10 is installed in the bypass passage 4 so that the extending direction of the cantilever portion 12 is substantially perpendicular to the extending direction of the bypass passage 4 (that is, the flowing direction of the fluid in the bypass passage 4) and the axial direction of the opening 111 of the support substrate 11 is substantially parallel to the extending direction of the bypass passage 4. In the example illustrated in FIG. 1, although the bypass passage 4 is bent midway, the shape of the bypass passage 4 is not particularly limited thereto. For example, as illustrated in FIG. 5, the bypass passage 4 may have a shape where the bypass passage is not bent midway. FIG. 5 is a diagram illustrating a modified example of the bypass passage 4.

In the case where the fluid flows through the main flow passage 2, pressure loss occurs due to friction with the wall surface, and thus, the pressure becomes small toward the downstream side, so that the pressure of the downstream opening 6 of the bypass passage 4 is lower than the pressure of the upstream opening 5. On the other hand, the gap 122 of the differential pressure detection element 10 is narrowed to such a degree that almost no fluid flows. Therefore, the pressure of the upstream opening 5 is applied to the upstream side of the cantilever portion 12, whereas the pressure of the downstream opening 6 is applied to the downstream side of the cantilever portion 12. The cantilever portion 12 of the differential pressure detection element 10 is elastically deformed in accordance with the pressure difference between the openings 5 and 6, and thus, distortion occurs in the piezoresistive portions 131 and 132.

The flow rate calculation unit 20 detects changes in the resistance values of the piezoresistive portions 131 and 132 corresponding to the differential pressure through the wiring portions 16 and 17. The flow rate calculation unit 20 calculates the flow rate of the fluid on the basis of the differential pressure in the main flow passage 2 by using the fact that there is a correlation between the pressure loss of the fluid and the flow rate. The flow rate calculation unit 20 can be configured with, for example, a computer, an analog circuit, or the like.

Hereinafter, a method of manufacturing the differential pressure detection element 10 according to one or more embodiments will be described with reference to FIGS. 6 to 8.

Figure 6:
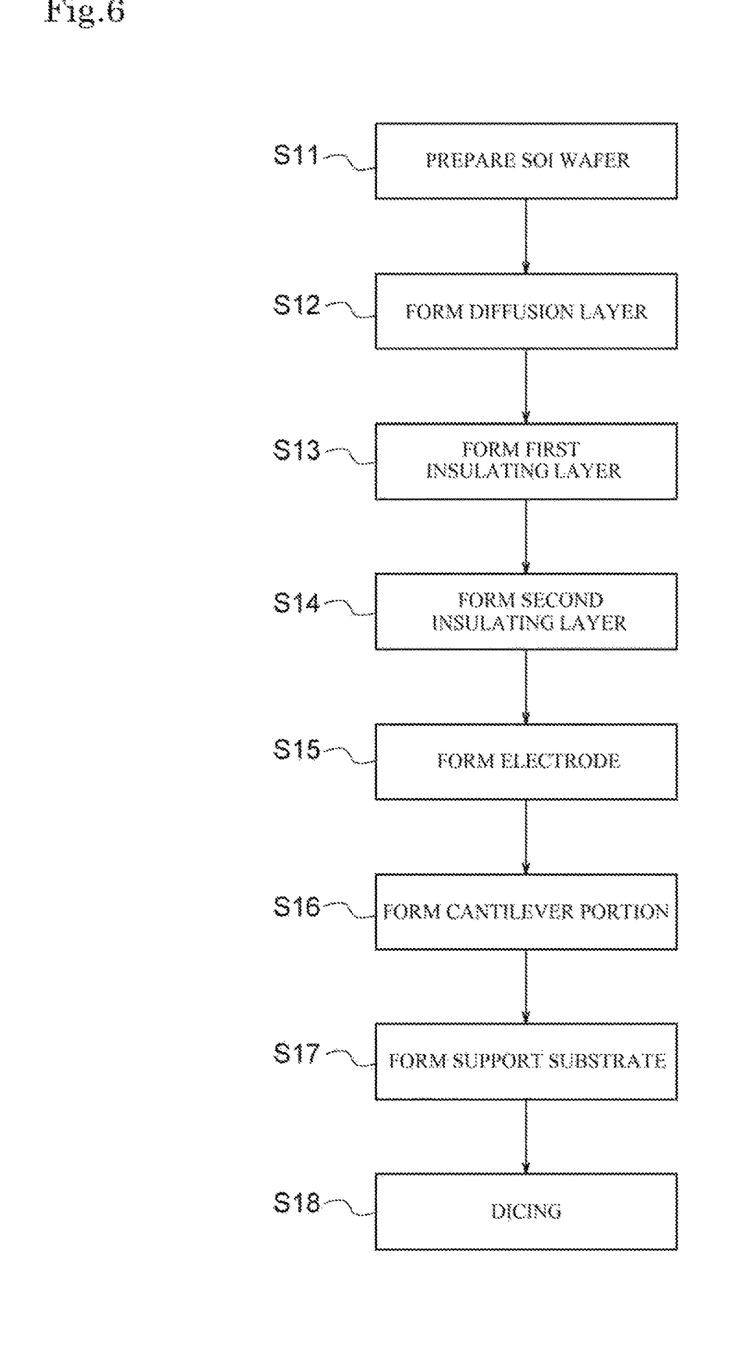
FIG. 6 is a flowchart illustrating a method of manufacturing a differential pressure detection element according to one or more embodiments of the invention.
Figure 7:
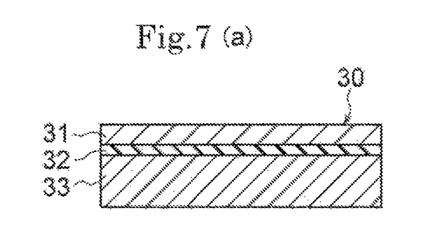
FIGS. 7(a) to 7(g) are cross-sectional views illustrating the steps of FIG. 6 according to one or more embodiments of the invention.
Figure 8A:
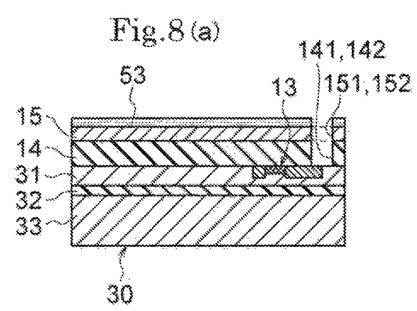
FIGS. 8(a) to 8(f) are cross-sectional views illustrating the steps of FIG. 6 according to one or more embodiments of the invention.
Figure 8B:
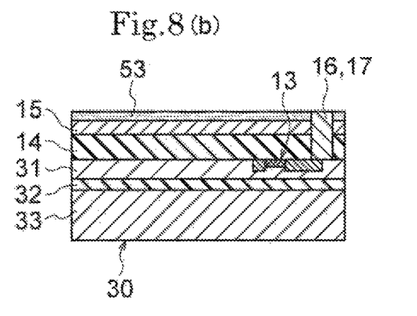
Figure 8C:
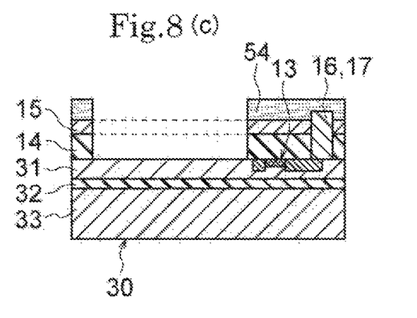
Figure 8D:
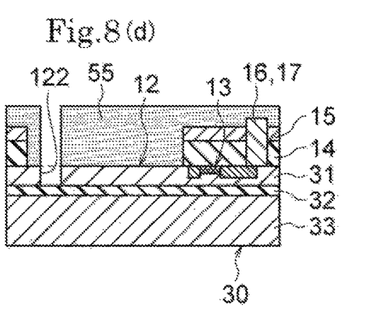
Figure 8E:
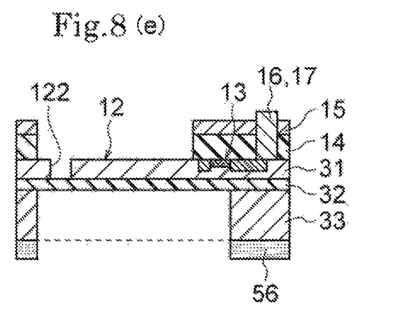
Figure 8F:
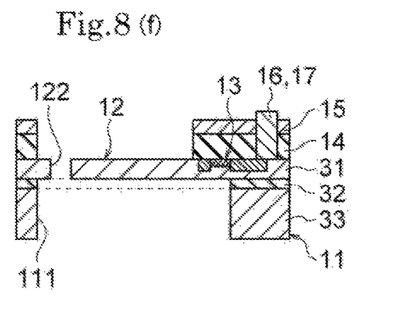

FIG. 6 is a flowchart illustrating the method of manufacturing the differential pressure detection element according to one or more embodiments, and FIGS. 7(a) to 8(f) are cross-sectional views illustrating the steps of FIG. 6.

First, in step S11 of FIG. 6, as illustrated in FIG. 7(a), an SOI wafer 30 is prepared. The SOI wafer 30 is configured to include a first silicon layer 31 (active layer), a silicon oxide layer 32 (BOX (Buried Oxide) layer), and a second silicon layer 33 (handle layer). The three layers 31 to 33 are laminated so that the silicon oxide layer 32 is interposed between the two silicon layers 31 and 33. The SOI wafer 30 according to one or more embodiments corresponds to an example of the SOI substrate in the invention.

As a method of forming the SOI wafer 30, there may be exemplified a method of bonding another silicon substrate to a silicon substrate having a silicon oxide layer formed thereon, an SIMOX (Separation by Implanted Oxygen) method, a smart cut method, or the like.

Next, in step S12 of FIG. 6, a diffusion layer 13 is formed in the first silicon layer 31 of the SOI wafer 30.

More specifically, as illustrated in FIG. 7(b), a thermal oxidation process is performed on the SOI wafer 30 to form a thermal silicon oxide layer 41 in the first silicon layer 31. The thermal silicon oxide layer 41 constitutes a portion of the above-described first insulating layer 16. The thermal silicon oxide layer 41 has a function of suppressing channeling of ions during ion implantation at the time of forming the diffusion layer 13 and a function of suppressing outward diffusion of ions during annealing after the ion implantation.

Next, as illustrated in FIG. 7(c), a first resist layer 51 is formed on the thermal silicon oxide layer 41. The first resist layer 51 has openings corresponding to the shapes of the lead portions 133 to 135 of the diffusion layer 13.

Next, as illustrated in the same figure, the lead portions 133 to 135 are formed by doping the first silicon layer 31 with p-type impurities through the opening of the first resist layer 51, and after that, the first resist layer 51 is removed.

Next, as illustrated in FIG. 7(d), a second resist layer 52 is formed on the SOI wafer 30. The second resist layer 52 has openings corresponding to the shape of the entire diffusion layer 13 including the piezoresistive portions 131 and 132.

Next, as illustrated in the same figure, the first silicon layer 31 is doped with p-type impurities through the opening of the second resist layer 52 to form the piezoresistive portions 131 and 132, and after that, the second resist layer 52 is removed.

As a method of doping the first silicon layer 31 of the SOI wafer 30 with impurities, there are exemplified an ion implantation method and the like. At this time, ion implantation is controlled so that the impurity concentration in the wiring portions 133 to 135 is higher than the impurity concentration in the piezoresistive portions 131 and 132.

Next, as illustrated in step S13 of FIG. 6, a first insulating layer 14 covering the diffusion layer 13 is formed on the entire surface of the SOI wafer 30.

More specifically, as illustrated in FIG. 7(e), a silicon oxide film is further deposited on the thermal silicon oxide layer 41 by a CVD (Chemical Vapor Deposition) method to form a deposited silicon oxide layer 42.

Next, as illustrated in FIG. 7(f), an annealing process is performed on the thermal silicon oxide layer 41 and the deposited silicon oxide layer 42 that are laminated on each other to integrate the two silicon oxide layers 41 and 42, so that the first insulating layer 14 is formed. In the annealing process in step S13, for example, the temperature is increased up to about 900° C. to 1200° C. The temperature of the annealing process corresponds to an example of the layer formation temperature of the first insulating layer in the invention.

Next, in step S14 of FIG. 6, as illustrated in FIG. 7(g), by depositing a silicon nitride film on the first insulating layer 14 by LPCVD (Low Pressure Chemical Vapor Deposition) method, the second insulating layer 15 is formed. In the LPCVD method in step S14, the temperature is increased up to, for example, about 500° C. to 800° C. The temperature of the LPCVD method corresponds to an example of the layer formation temperature of the second insulating layer in the invention.

Herein, if it is assumed that the linear expansion coefficient is constant with respect to temperature, in the cooling process after the formation of the first insulating layer 14 (that is, after the annealing process in the above-described step S13), a thermal stress $\sigma_1$ occurring in the first insulating layer 14 can be expressed by the following Mathematical Formula (4).

[Math. 4]
$$\sigma_1 = \frac{E_1}{1-v_1}(\alpha_1 - \alpha_0)dT_1 \qquad (4)$$

In the above Mathematical Formula (4), $\alpha_0$ is a linear expansion coefficient of the material of which the cantilever portion 12 is composed, $\alpha_1$ is a linear expansion coefficient of the first insulating layer 14, $v_1$ is a Poisson's ratio of the first insulating layer 14, $E_1$ is a Young's modulus of the first insulating layer 14, and $dT_1$ is a temperature difference in the cooling process after the formation of the first insulating layer 14 (that is, a difference between the maximum temperature in the annealing process in step S13 described above and the room temperature).

On the other hand, in the cooling process after the formation of the second insulating layer 15 (that is, after the second insulating layer 15 is formed by an LPCVD method in the above-described step S14), a thermal stress $\sigma_2$ occurring in the second insulating layer 15 can be expressed by the following Mathematical Formula (5).

[Math. 5]
$$\sigma_2 = \frac{E_2}{1-v_2}(\alpha_2 - \alpha_1)dT_2 \qquad (5)$$

Herein, in the above Mathematical Formula (5), $\alpha_2$ is a linear expansion coefficient of the second insulating layer 15, $v_2$ is a Poisson's ratio of the second insulating layer 15, $E_2$ is a Young's modulus of the second insulating layer 15, and $dT_2$ is a temperature difference in the cooling process after the formation of the second insulating layer 15 (that is, a difference between the maximum temperature in the LPCVD method in step S14 described above and the room temperature).

Since both the first and second insulating layers 14 and 15 are thin films, if the film stress is approximated to be uniformly distributed in the film cross section, an equilibrium equation such as the following Mathematical Formula (6) is derived. In the case where Mathematical Formula (6) is satisfied, the warp amount of the cantilever portion 12 becomes zero due to the equilibrium of the film stress.

[Math. 6]
$$\sigma_1 w_1 + \sigma_2 w_2 = 0 \qquad (6)$$

Therefore, in one or more embodiments, the above-described steps S13 and S14 are executed so as to satisfy the following Mathematical Formula (7) on the basis of the above-described Mathematical Formulas (3) to (6). As a result, the warp of the cantilever portion 12 can be more appropriately canceled out by the second insulating layer 15, and thus, the symmetry of the sensitivity of the differential pressure detection element 10 in the pressure application direction can be further improved.

[Math. 7]
$$0 < \frac{w_2}{w_1} \le -\frac{E_1(1-v_2)(\alpha_1 - \alpha_0)dT_1}{E_2(1-v_1)(\alpha_2 - \alpha_1)dT_2} \times 2 \qquad (7)$$

In one or more embodiments, the thickness $w_1$ of the first insulating layer 14 in the above-described Mathematical Formulas (6) and (7) is defined as a sum of the thickness of the thermal silicon oxide layer 41 formed in the above-described step S12 and the thickness of the deposited silicon oxide layer 42 formed in the above-described step S13.

Next, in step S15 of FIG. 6, wiring portions 16 and 17 are formed.

More specifically, as illustrated in FIG. 8(a), a third resist layer 53 is formed on the second insulating layer 15. The third resist layer 53 has openings corresponding to the shapes of the wiring portions 16 and 17.

Next, as illustrated in the same figure, an etching process is performed on the first and second insulating layers 14 and 15 through the opening of the third resist layer 53. Therefore, the opening 141, 142, 151, and 152 of the first and second insulating layers 14 and 15 are formed.

Next, as illustrated in FIG. 8(b), the openings 141, 142, 151, and 152 of the first and second insulating layers 14 and 15 are filled with a conductive material, and after that, the third resist layer 53 is removed. As a result, the wiring portions 16 and 17 are formed. As such a conductive material, there may be exemplified a metal material such as copper, aluminum, and gold. As a method of filling with the conductive material, there may be exemplified sputtering, vacuum deposition, plating, and the like.

Next, in step S16 of FIG. 6, the cantilever portion 12 is formed.

More specifically, as illustrated in FIG. 8(c), a fourth resist layer 54 is formed on the second insulating layer 15 and the wiring portions 16 and 17. The fourth resist layer 54 has an opening corresponding to a region including the cantilever portion 12 excluding the fixed end 121 in the first silicon layer 31.

Next, as illustrated in the same figure, an etching process is performed on the first and second insulating layers 14 and 15 through the opening of the fourth resist layer 54. As a result, in the first silicon layer 31, a region including the cantilever portion 12 excluding the fixed end 121 is exposed from the first and second insulating layers 14 and 15.

Next, as illustrated in FIG. 8(d), a fifth resist layer 55 is formed on the first silicon layer 31, the second insulating layer 15, and the wiring portions 16 and 17. The fifth resist layer 55 has an opening corresponding to the shape of the above-described gap 122 between the support substrate 11 and the cantilever portion 12.

Next, as illustrated in the same figure, an etching process is performed on the first silicon layer 31 through the opening of the fifth resist layer 55. Therefore, the cantilever portion 12 is defined by the gap 122. At this time, the silicon oxide layer 32 of the SOI wafer 30 functions as an etching stopper.

Next, in step S17 of FIG. 6, the support substrate 11 is formed.

More specifically, as illustrated in FIG. 8(e), a sixth resist layer 56 is formed on the lower surface of the SOI wafer 30. The sixth resist layer 56 has an opening corresponding to the shape of the opening 111 of the above-described support substrate 11.

Next, as illustrated in the same figure, an etching process is performed on the second silicon layer 33 from the lower side. At this time, the silicon oxide layer 32 of the SOI wafer 30 functions as an etching stopper.

Next, after removing the sixth resist layer 56, as illustrated in FIG. 8(f), an etching process is performed on the silicon oxide layer 32 from the lower side to form the support substrate 11 having the opening 111.

By executing steps S11 to S17 described above, a large number of differential pressure detection elements 10 are collectively formed on one SOI wafer 30. Therefore, in step S18 of FIG. 6, the individual differential pressure detection elements 10 are achieved by dicing the multiple differential pressure detection elements 10 in the form of individual pieces.

As described above, in one or more embodiments, the second insulating layer 15 is laid on the first insulating layer 14, and the linear expansion coefficient of the second insulating layer 15 is set to be larger than the linear expansion coefficient of the first insulating layer 14. Therefore, the warp of the cantilever portion 12 can be canceled out, and thus, the offset voltage of the differential pressure detection element 10 can be reduced.

Furthermore, in one or more embodiments, since the silicon nitride layer 15 is laid on the silicon oxide layer 14, it is possible to prevent the phenomenon that the cantilever portion is deflected as time elapses due to penetration of moisture into the silicon oxide layer and expansion of the silicon oxide layer. As a result, for example, it is possible to prevent the position of the cantilever portion 12 in the offset state from changing with time.

Step S12 of FIG. 6 corresponds to an example of a first step in the invention, step S13 of FIG. 6 corresponds to an example of a second step in the invention, and step S14 of FIG. 6 corresponds to an example of a third step in the invention.

It should be noted that the embodiments described above are described for the better understanding of the invention and are not described for the limitation of the invention. Therefore, each component disclosed in one or more embodiments described above includes all design changes and equivalents belonging to the technical scope of the invention.

For example, in one or more embodiments described above, the first insulating layer 14 is formed by annealing the two layers of the thermal silicon oxide layer 41 formed by the thermal oxidation process and the deposited silicon oxide layer 42 formed by the CVD method. However, the method of forming the first insulating layer 14 is not particularly limited thereto. For example, the first insulating layer 14 may be configured with a single layer of a silicon oxide layer formed by any of a thermal oxidation method, a CVD method, a spin coating method, or the like.

EXPLANATIONS OF LETTERS OR NUMERALS

1: flow rate measurement device
2: main flow passage
3: orifice
4: bypass passage
5: upstream opening
6: downstream opening
10: differential pressure detection element
11: support substrate
111: through-hole
112: upper surface
12: cantilever portion
121: fixed end
122: gap
13: diffusion layer
131, 132: piezoresistive portion
133 to 135: lead portion
14: first insulating layer
141, 142: opening
15: second insulating layer
151, 152: opening
16, 17: wiring portion
20: flow rate calculation unit
30: SOI wafer
31: first silicon layer
32: silicon oxide layer
33: second silicon layer
41: thermal silicon oxide layer
42: deposited silicon oxide layer
51 to 56: first to sixth resist layers Although the disclosure has been described with respect to only a limited number of embodiments, those skill in the art, having benefit of this disclosure, will appreciate that various other embodiments may be devised without departing from the scope of the present invention. Accordingly, the scope of the invention should be limited only by the attached claims.

The invention claimed is:

1. A differential pressure detection element comprising:
a support portion having an opening;
a cantilever portion supported in a cantilever manner by the support portion so as to protrude into the opening;
a diffusion layer including a piezoresistive portion provided at a fixed end of the cantilever portion;
a pair of wiring portions electrically connected to the diffusion layer;
a first insulating layer covering the diffusion layer; and
a second insulating layer laid on the first insulating layer, wherein
a linear expansion coefficient of the first insulating layer is smaller than a linear expansion coefficient of a material of which the cantilever portion is composed, and
a linear expansion coefficient of the second insulating layer is larger than the linear expansion coefficient of the first insulating layer.

2. The differential pressure detection element according to claim 1, wherein
the cantilever portion is composed of silicon,
the first insulating layer is a silicon oxide layer, and
the second insulating layer is a silicon nitride layer.

3. The differential pressure detection element according to claim 1, wherein
the following Mathematical Formula (1) is satisfied, and

[Math. 1]

$$0 < \frac{w_2}{w_1} \le \frac{1}{2} \quad (1)$$

in the above Mathematical Formula (1), $w_1$ is a thickness of the first insulating layer, and $w_2$ is a thickness of the second insulating layer.

4. The differential pressure detection element according to claim 1, wherein
the diffusion layer includes a lead portion electrically connecting a pair of the wiring portions and the piezoresistive portion in series, and
an impurity concentration in the lead portion is higher than an impurity concentration in the piezoresistive portion.

5. A flow rate measurement device configured to detect a flow rate of a fluid flowing through a main flow passage, comprising:
the differential pressure detection element according claim 1;
a bypass passage communicating with the main flow passage through a pair of communication ports and being provided with the differential pressure detection element; and
a flow rate calculation unit calculating the flow rate of the fluid on the basis of an output of the differential pressure detection element.

6. A method of manufacturing the differential pressure detection element according to claim 1, comprising:
a first step of forming the diffusion layer by doping one silicon layer of the SOI substrate with impurities;
a second step of forming the first insulating layer on the diffusion layer; and
a third step of forming the second insulating layer on the first insulating layer, wherein
a first layer formation temperature in the second step is 1200° C. or less, and
a second layer formation temperature in the third step is 800° C. or less.

7. The method of manufacturing the differential pressure detection element according to claim 6, wherein
the following Mathematical Formula (2) is satisfied,

[Math. 2]

$$0 < \frac{w_2}{w_1} \le -\frac{E_1(1-v_2)(\alpha_1-\alpha_0)dT_1}{E_2(1-v_1)(\alpha_2-\alpha_1)dT_2} \times 2 \quad (2)$$

in the above Mathematical Formula (2),
$\alpha_0$ is a linear expansion coefficient of a material of which the cantilever portion is composed,
$\alpha_1$ is a linear expansion coefficient of the first insulating layer,
$v_1$ is a Poisson's ratio of the first insulating layer,
$E_1$ is a Young's modulus of the first insulating layer,
$dT_1$ is a temperature difference in the cooling process after forming the first insulating layer,
$w_1$ is a thickness of the first insulating layer,
$\alpha_2$ is a linear expansion coefficient of the second insulating layer,
$v_2$ is a Poisson's ratio of the second insulating layer,
$E_2$ is a Young's modulus of the second insulating layer,
$dT_2$ is a temperature difference in the cooling process after forming the second insulating layer, and
$w_2$ is a thickness of the second insulating layer.

8. The method of manufacturing the differential pressure detection element according to claim 6, wherein
the first step includes forming a thermal silicon oxide layer by performing a thermal oxidation process on the silicon layer,
the second step includes:
forming a deposited silicon oxide layer on the thermal silicon oxide layer by a CVD method; and
forming the first insulating layer by performing an annealing process on the thermal silicon oxide layer and the deposited silicon oxide layer,
the third step includes forming the silicon nitride layer by a CVD method,
the first layer formation temperature in the second step is a temperature of the annealing process in the second step, and
the second layer formation temperature in the third step is a temperature of the CVD method in the third step.

\* \* \* \* \*